(12) United States Patent
Tiwari et al.

(10) Patent No.: US 9,911,570 B2
(45) Date of Patent: Mar. 6, 2018

(54) ANTIWETTING COATING FOR LIQUID METAL

(71) Applicant: VAREX IMAGING CORPORATION, Salt Lake City, UT (US)

(72) Inventors: Santosh K. Tiwari, Salt Lake City, UT (US); Kasey Greenland, West Jordan, UT (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 139 days.

(21) Appl. No.: 14/968,078

(22) Filed: Dec. 14, 2015

(65) Prior Publication Data
US 2017/0169984 A1 Jun. 15, 2017

(51) Int. Cl.
*H01J 35/10* (2006.01)
*H01J 35/18* (2006.01)
(Continued)

(52) U.S. Cl.
CPC ............ *H01J 35/101* (2013.01); *B65D 25/14* (2013.01); *C23C 16/0254* (2013.01);
(Continued)

(58) Field of Classification Search
CPC .. H01J 35/101; H01J 35/26; H01J 2235/1006; H01J 2235/102; H01J 2235/1053; H01J 35/24
(Continued)

(56) References Cited

U.S. PATENT DOCUMENTS 4,614,445 A 9/1986 Gerkema et al.
5,077,776 A 12/1991 Vetter
(Continued)

OTHER PUBLICATIONS

A.H. Deutchman, and R.J. Partyka, "Comparison of the Properties of PVD and IBED Hardcoats (TiN and Cr2N)," Proceeding of the 13th Annual Sur Proceeding of the 13th Annual Surface Engineering Congress, Oct. 2002, pp. 1-8, ASM International, Columbus, Ohio.
(Continued)

*Primary Examiner* — Don Wong
(74) *Attorney, Agent, or Firm* — Maschoff Brennan

(57) ABSTRACT

Technology is described for an antiwetting coating attached to a substrate (e.g., metal substate) on a liquid metal container. In one example, the liquid metal container includes a first enclosure member, a second enclosure member, liquid metal, and an antiwetting coating. The first enclosure member includes a first substrate with a first surface. The second enclosure member includes a second substrate with a second surface. The first enclosure member is positioned proximate to the second enclosure member such that a gap is formed between the first surface and the second surface. The liquid metal positioned within the gap. An antiwetting coating attached to the first surface and/or the second surface. The antiwetting coating includes chromium nitride (CrN), dichromium nitride ($Cr_2N$), chromium (III) oxide ($Cr_2O_3$), and/or titanium aluminum nitride (TiAlN) attached to the first surface and/or the second surface.

20 Claims, 10 Drawing Sheets

(51) Int. Cl.
- *F16C 33/66* (2006.01)
- *C23C 16/02* (2006.01)
- *C23C 16/34* (2006.01)
- *F16N 19/00* (2006.01)
- *B65D 25/14* (2006.01)

(52) U.S. Cl.
CPC .......... *C23C 16/34* (2013.01); *F16C 33/6651* (2013.01); *F16N 19/00* (2013.01); *H01J 35/18* (2013.01); *H01J 2235/1026* (2013.01); *H01J 2235/1046* (2013.01); *H01J 2235/18* (2013.01)

(58) Field of Classification Search
USPC .......................... 378/125, 132, 144; 384/625
See application file for complete search history.

(56) References Cited

U.S. PATENT DOCUMENTS

| | | | |
|---|---|---|---|
| 5,298,293 A | 3/1994 | Ono et al. | |
| 5,875,227 A | 2/1999 | Bhatt | |
| 6,377,658 B1 | 4/2002 | Vermilyea et al. | |
| 7,127,035 B2 * | 10/2006 | Anno | F16C 17/026 378/130 |
| 8,300,770 B2 | 10/2012 | Coon et al. | |
| 8,897,420 B1 * | 11/2014 | Hunt | H01J 35/24 378/125 |
| 2013/0235978 A1 | 9/2013 | Allen et al. | |
| 2014/0355743 A1 | 12/2014 | Hunt et al. | |

OTHER PUBLICATIONS

A.H. Deutchman, and R.J. Partyka, "Industrial Scale Ion Beam Enhanced Deposition (IBED) Processing System," Proceedings: ASM International Su Proceedings: ASM International Surface Engineering Congress, Oct. 2002, pp. 1-9, ASM International, Columbus, Ohio.

A.H. Deutchman, and R.J. Partyka, "Ion Beam Enhanced Deposited (IBED) Tribological Coatings for Non-Ferrous Alloys," Proceedings: ASM International Su Proceedings: ASM International Surface Engineering Congress, Oct. 2002, pp. 1-5, ASM International, Columbus, Ohio.

Lei Shan, Yong-xin Wang, Jin-long Li, He Li, Xia Lu, and Jian-min Chen, "Structure and mechanical properties of thick Cr/Cr2N/CrN multilayer coating deposited by multi-arc ion plating," Science Direct, May 25, 2014, pp. 1135-1143, Trans. Nonferrous Met. Soc. C Science Direct, May 25, 2014, pp. 1135-1143, Trans. Nonferrous Met. Soc. China, China.

What is IBED Technology?, webpage http://www.beamalloy.net/storedd3d.html?pid=26524&catid=19951, accessed Oct. 13, 2015, Beamalloy Technologies, LLC, Plain City, OH.

* cited by examiner

FIG. 3
(Table 1)

| Property | TiN | CrN | $Cr_2N$ | $Cr_2O_3$ | TiAlN | $TiO_2$ | TiCN | $Al_2O_3$ |
|---|---|---|---|---|---|---|---|---|
| Mohs Hardness | 9 | 7 | | 8-8.5 | | 5-6 | | 9 |
| Vickers Hardness (HV) | 2000-2400 | 1100-1800 | 1700-3000 | 1500-3000 | 2600-3400 | | | |
| Abrasion Resistance (μm/10k cycles) | 0.02 | 0.03 | 0.12 | | 0.04 | | <0.02 | |
| Adhesion ASTM Class | 5B | 5B | 5B | 4B-5B | 5B | | 5B | |
| Corrosion Resistance | High | >TiN | High | High | High | | High | |
| Chemical Reactivity | Inert | Resist Ga | Resist Ga | Resist Ga | Resist Ga | | Resist Ga | |
| Temperature Resistance | 500-600° C | 700° C | 700° C | 1100° C | 800° C | | 400° C | |
| Thermal Conductivity (W/(m·K)) | 11.9-19.2 | 11.7 | >10 | 1.7-17 | 4.5-8 | 1.7-17 | | 15.9-35 |
| Electrical Resistivity (Ω·m) | 30-70 × $10^{-6}$ | 1.5-12 × $10^{-3}$ | 79-89 × $10^{-6}$ | 15 × $10^7$ | >TiN | | | $10^{13-15}$ |
| Friction Coefficient | 0.40 | 0.50 | 0.70 | 0.30 | 0.35 | 0.30 | 0.25 | |
| Coating Density and Continuity | High | High | High | High | High | | High | |

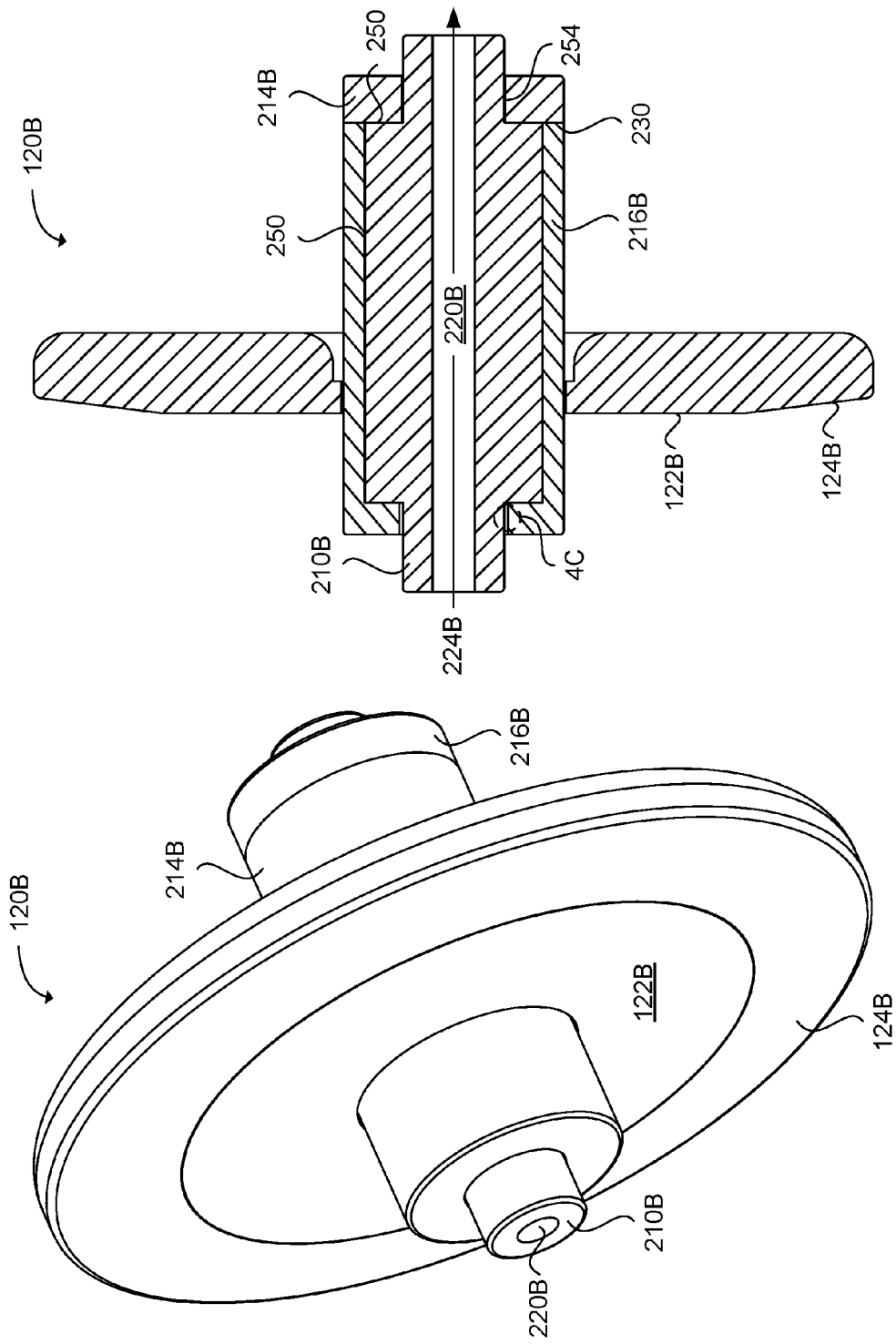

ANTIWETTING COATING FOR LIQUID METAL

BACKGROUND

Unless otherwise indicated herein, the approaches described in this section are not prior art to the claims in this disclosure and are not admitted to be prior art by inclusion in this section.

An x-ray system typically includes an x-ray tube and a detector. The x-ray tube emits radiation, such as x-rays, toward an object. The object is positioned between the x-ray tube and the detector. The radiation typically passes through the object and impinges on the detector. As radiation passes through the object, internal structures of the object cause spatial variances in the radiation received at the detector. The detector then generates data based on the detected radiation, and the system translates the radiation variances into an image, which may be used to evaluate the internal structure of the object, such as a patient in a medical imaging procedure or an inanimate object in an inspection scan.

The x-ray tube includes a cathode and an anode. X-rays are produced in x-ray tubes by applying an electrical current to a filament positioned within the cathode to cause electrons to be emitted from the cathode by thermionic emission. In a vacuum, the electrons accelerate towards and then impinge upon the anode. When the electrons collide with a target on the anode, some of the energy is emitted as x-rays, and the majority of the energy is released as heat. The area on the anode in which the electrons collide is generally known as the focal spot. Because of high temperatures generated when the electron beam strikes the target, specifically the focal spot, the anode can include features to distribute the heat generated at the focal spot on the target, such as rotating a disc-shaped anode target at a high rotational speed. A rotating anode typically includes the disc-shaped anode target, which is rotated by an induction motor via a bearing assembly. Due to the close proximity of the bearing assembly to heat sources of the anode and cathode, the bearing assembly typically operates at high temperatures (e.g., exceeding 200° C.). The combination of the high temperature and high rotational speed of the anode places stringent demands on the bearing assembly.

In addition, the x-ray tube may also be used in a computed tomography (CT) scanner, which includes a gantry that rotates both the x-ray tube and the detector to generate various images of the object at different angles. The gravitational (G) forces imposed by higher gantry speeds and higher anode rotational speeds used in CT scanners can produce additional stresses on the bearing assembly.

Conventional bearing assemblies include tool steel ball bearings and tool steel raceways positioned within the vacuum region and uses lubrication by a solid lubricant, such as silver (Ag) or lead (Pb). Wear and loss of the silver from the bearing contact region increases acoustic noise and can slow down the rotor during operation. In addition, the ball bearings and raceways have limited contact surface areas, which lead to poor thermal conductivity. As a result, new bearing solutions are needed for improved performance under the stringent operating conditions of x-ray tubes in next generation x-ray systems. The technology (systems, devices, and methods) described herein provides bearing solutions with improved performance over conventional bearing assemblies.

BRIEF SUMMARY OF SOME EXAMPLE EMBODIMENTS

A liquid metal bearing (LMB) overcomes many of the challenges of the conventional bearing assemblies used in x-ray tubes. In an example, the bearing assembly includes a stationary component, a rotatable component (rotary component), and a liquid metal positioned within a gap between the stationary component and the rotatable component. The stationary component includes a first base substrate with a first surface, and the rotatable component includes a second base substrate with a second surface. In an example, the first substrate or the second substrate includes a metal, such as molybdenum (Mo) or an iron (Fe) alloy (e.g., stainless steel). The rotatable component is positioned proximate to the stationary component such that the gap is formed between the first surface and the second surface. The liquid metal acts as a lubricant and can include a metal that is in a liquid state at the operating temperature range of the bearing assembly, such as gallium (Ga), indium (In), tin (Sn), or alloys of these metals. To contain the liquid metal in the bearing assembly, an antiwetting coating is attached to the first surface, the second surface, or both. The antiwetting coating repels the liquid metal and acts to contain the liquid metal and thereby prevent (or minimize) leakage of the liquid metal at the interfaces between different stationary components and between the stationary component and the rotatable component. The antiwetting coating includes chromium nitride (CrN), dichromium nitride ($Cr_2N$), chromium (III) oxide ($Cr_2O_3$), or titanium aluminum nitride (TiAlN).

In another example, an x-ray tube includes the bearing assembly along with an anode mechanically coupled to the bearing assembly and an insert to enclose a vacuum or to contain stray electrons, the bearing assembly, and the anode. The x-ray tube can also include a rotor, a stator, a cathode, and a housing to enclose the insert and the stator. The housing includes a radiation window. The housing is configured to contain stray or off-focus radiation and allows focused x-rays to exit through the radiation window. The cathode is positioned within the insert. The rotor is coupled to the bearing assembly, such as a shaft or a sleeve. The rotor and the stator are configured to electromagnetically rotate the bearing assembly.

Although the antiwetting coating is beneficial for bearing assemblies and x-ray tubes, the antiwetting coating may also be used more generally in other applications to contain or minimize leakage of liquid metal between metal interfaces. For example, a liquid metal container includes a first enclosure member, a second enclosure member, and a liquid metal positioned within a gap between the first enclosure member and the second enclosure member. The first enclosure member includes a first substrate with a first surface. The second enclosure member includes a second substrate with a second surface. The first enclosure member is positioned proximate to the second enclosure member such that the gap is formed between the first surface and the second surface. The liquid metal in the liquid metal container is contained using an antiwetting coating is attached to the first surface, the second surface, or both. The antiwetting coating includes chromium nitride (CrN), dichromium nitride ($Cr_2N$), chromium (III) oxide ($Cr_2O_3$), titanium aluminum nitride (TiAlN), or combinations thereof.

Another example provides a method of forming an antiwetting coating on a substrate (e.g., metal substrate) of a bearing component (e.g., metal bearing component). The method includes the operation of providing a bearing component. The next operation of the method can include patterning a spiral groove on the bearing component. The method can further include depositing the antiwetting coating that includes chromium nitride (CrN), dichromium nitride (Cr$_2$N), chromium (III) oxide (Cr$_2$O$_3$), titanium aluminum nitride (TiAlN), or combinations thereof onto the bearing component.

In another example, the method can further include determining the operational temperature of an x-ray device including the bearing component above an ambient temperature (e.g., 25° Celsius (C.)). The next operation of the method includes setting a specified temperature of the deposition chamber to a temperature between 10% and 90% of the operational temperature above the ambient temperature. The method can further include maintaining a deposition chamber that includes the bearing component and the antiwetting coating at a specified temperature less than 250° C.) during the depositing of the antiwetting coating. In another example, the method can further include oxidizing an exposed layer of the antiwetting coating after deposition of the antiwetting coating so the antiwetting coating includes an oxide layer.

In another example, the method can further include assembling the bearing component with a second bearing component (e.g., second metal bearing component) into a bearing assembly. A gap is formed between the bearing component and the second bearing component. The next operation of the method includes inserting liquid metal into the gap.

The summary provided above is illustrative and is not intended to be in any way limiting. In addition to the examples described above, further aspects, features, and advantages of the invention will be made apparent by reference to the drawings, the following detailed description, and the appended claims.

BRIEF DESCRIPTION OF THE DRAWINGS

FIG. 3 (i.e., Table 1) illustrates a table of antiwetting coating properties.

FIGS. 4A-4B illustrate various views of an example bearing assembly.

DETAILED DESCRIPTION OF SOME EXAMPLE EMBODIMENTS

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Numbers provided in flow charts and processes are provided for clarity in illustrating steps and operations and do not necessarily indicate a particular order or sequence. Unless otherwise defined, the term "or" can refer to a choice of alternatives (e.g., a disjunction operator, or an exclusive or) or a combination of the alternatives (e.g., a conjunction operator, and/or, a logical or, or a Boolean OR).

Disclosed embodiments relate generally to x-ray tubes and, more particularly, to an antiwetting coating for a liquid metal containment in an x-ray tube bearing and methods of making same.

Example embodiments illustrate liquid metal containment in an x-ray tube and other containers. In particular, example anode assemblies, bearing assemblies, and liquid metal containers disclosed herein include various structures configured to contain liquid metal within interface areas between two surfaces using an antiwetting coating that includes chromium nitride (CrN), dichromium nitride (Cr$_2$N), chromium (III) oxide (Cr$_2$O$_3$), or titanium aluminum nitride (TiAlN). In bearing assemblies, the antiwetting coating functions to contain the liquid metal between rotatable components and stationary components. In one example, containment of the liquid metal within the bearing assembly minimizes leakage of the liquid metal into the vacuum, prevents corrosion by the liquid metal of portions of the anode assembly outside the bearing assembly, and facilitates the dissipation of heat or the transfer of electrical current through the liquid metal. This dissipation of heat decreases thermally-induced deforming stresses in x-ray tube components, which thereby extends the operational life of the x-ray tube.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Example X-Ray Tube

Figure 1:
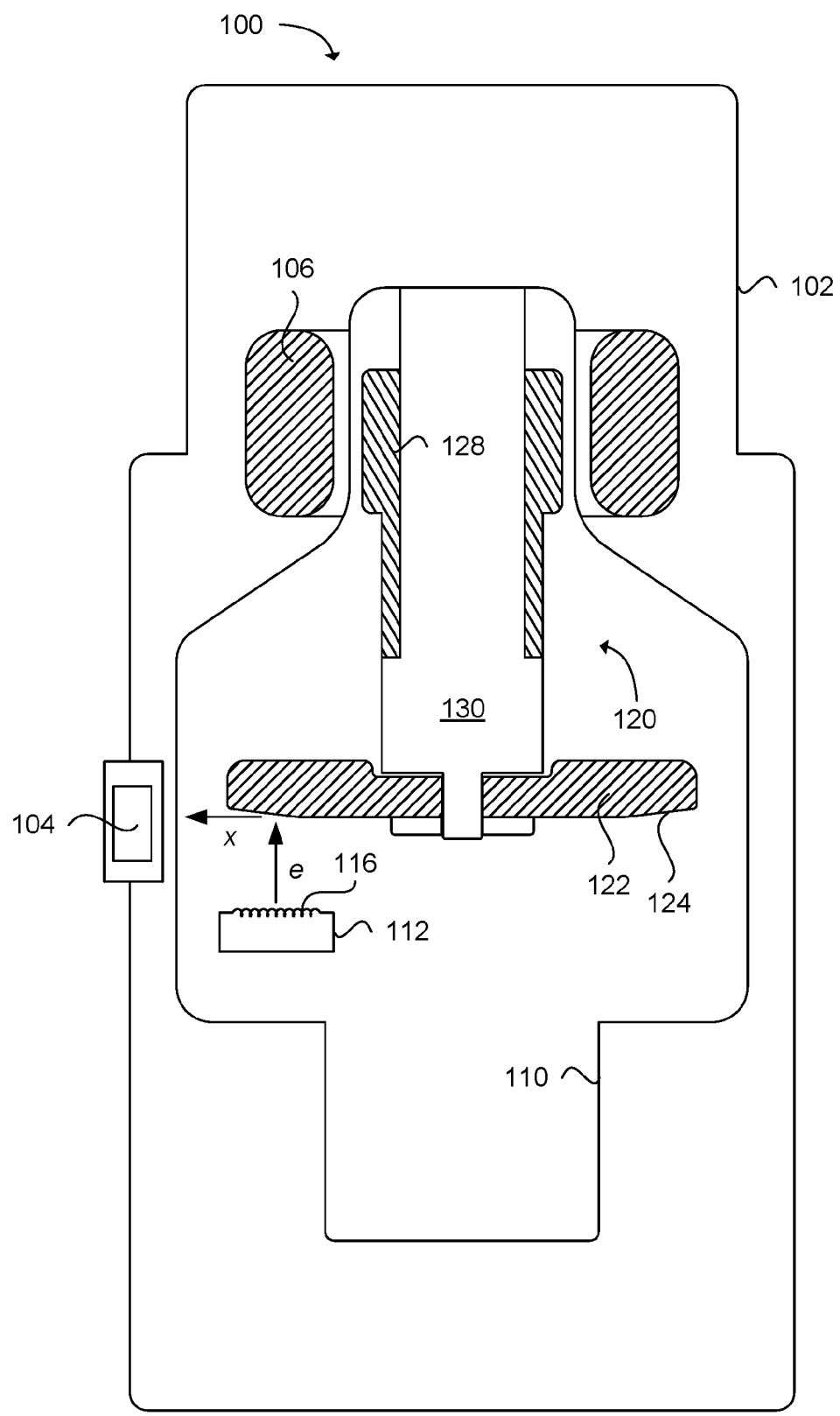
FIG. 1 illustrates a block diagram of an example x-ray tube.

FIG. 1 is a block diagram of an example rotary or rotating anode type x-ray tube 100 with a rotatable disc-shaped anode 122. The x-ray tube 100 includes a housing 102 and an x-ray insert 110 within the housing 102. The housing 102 encloses the insert 110. A coolant or air may fill the space or cavity between the housing 102 and the insert 110. A cathode 112 and an anode assembly 120 are positioned within an evacuated enclosure, also referred to as the insert 110. The anode assembly 120 includes the anode 122, a bearing assembly 130, and a rotor 128 mechanically coupled to the bearing assembly 130. The anode 122 is spaced apart from and oppositely disposed to the cathode 112. The anode 122 and cathode 112 are connected in an electrical circuit that allows for the application of a high voltage potential between the anode 122 and the cathode 112. The cathode 112 includes an electron emitter 116 that is connected to an appropriate power source (not shown).

As disclosed in FIG. 1, prior to operation of the example x-ray tube 100, the insert 110 is evacuated to create a vacuum. The insert 110 encloses the vacuum. Then, during operation of the example x-ray tube 100, an electrical current is passed through the electron emitter 116 of the cathode 112 to cause electrons "e" to be emitted from the cathode 112 by thermionic emission. The application of a high voltage differential between the anode 122 and the cathode 112 then causes the electrons "e" to accelerate from the cathode electron emitter toward a focal spot on a focal track 124 that is positioned on the anode 122. The focal track 124 may be composed for example of tungsten (W) and rhenium (Re) or other materials having a high atomic ("high Z") number. As the electrons "e" accelerate, they gain a substantial amount of kinetic energy, and upon striking the rotating focal track 124 some of this kinetic energy is converted into x-rays "x".

The focal track 124 is oriented so that emitted x-rays "x" are visible to an x-ray tube window 104. The x-ray tube window 104 includes an x-ray transmissive material, such as beryllium (Be), so the x-rays "x" emitted from the focal track 124 pass through the x-ray tube window 104 in order to strike an intended object (not shown) and then the detector to produce an x-ray image (not shown). FIG. 1 illustrates a single window 104 on the housing 102 (e.g., with a glass insert that allows radiation to pass through the glass of the insert). In other examples, a separate window may be included on both the insert 110 (e.g., a metal insert) and the housing 102, or a window may be included on just the insert 110.

As the electrons "e" strike the focal track 124, a significant amount of the kinetic energy of the electrons "e" is transferred to the focal track 124 as heat. To reduce the heat at a specific focal spot on the focal track 124, a disc-shaped anode target is rotated at high speeds, typically using an induction motor that includes a rotor 128 and a stator 106. The induction motor is an alternating current (AC) electric motor in which the electric current in the rotor 128 needed to produce torque is obtained by electromagnetic induction from a magnetic field of stator winding. Then, the rotor 128 rotates a hub of the bearing assembly 130 that is mechanically coupled to the anode 122, which rotates the anode 122.

While the anode 122 can withstand relatively high temperatures, other components of the anode assembly 120, such as conventional bearings, typically do not function well at high temperatures (e.g., exceeding 200° C.) and have poor thermal conduction properties to dissipate the heat.

Example Liquid Metal Bearing Assemblies

Figure 2B:
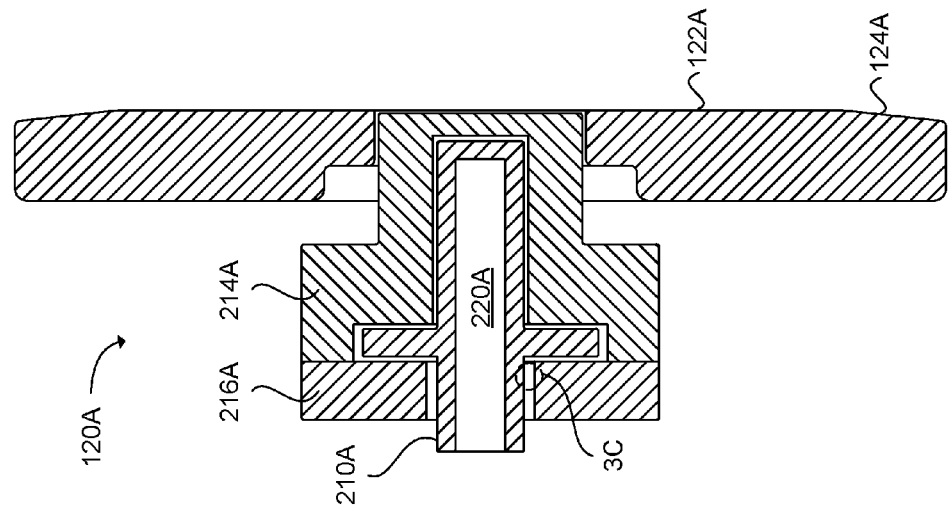
FIG. 2B illustrates a cross-sectional side view of an example anode assembly.
Figure 2A:
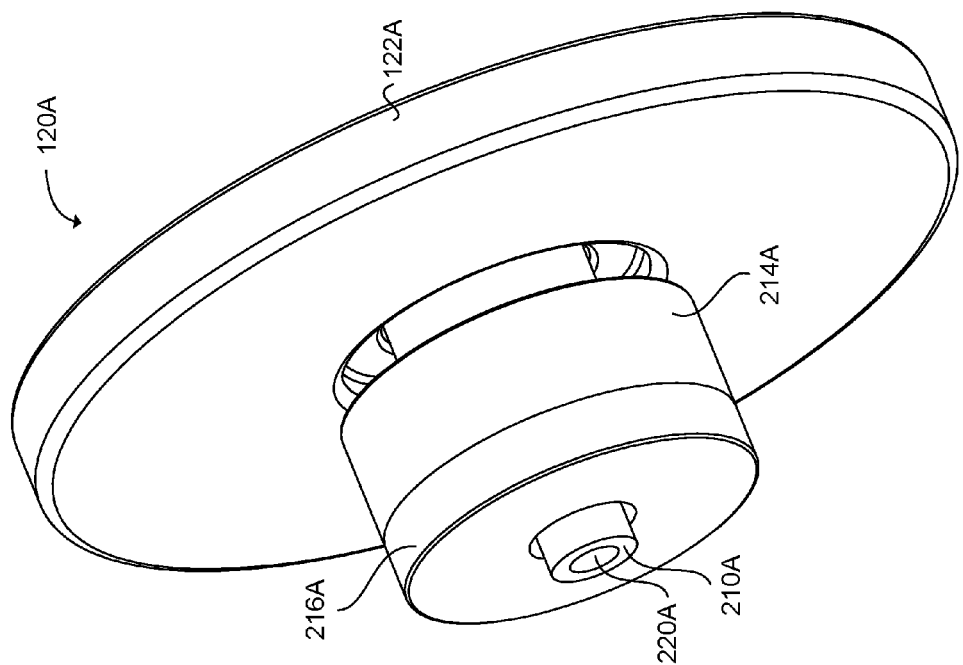
FIG. 2A illustrates a perspective view of an example anode assembly.
Figure 2C:
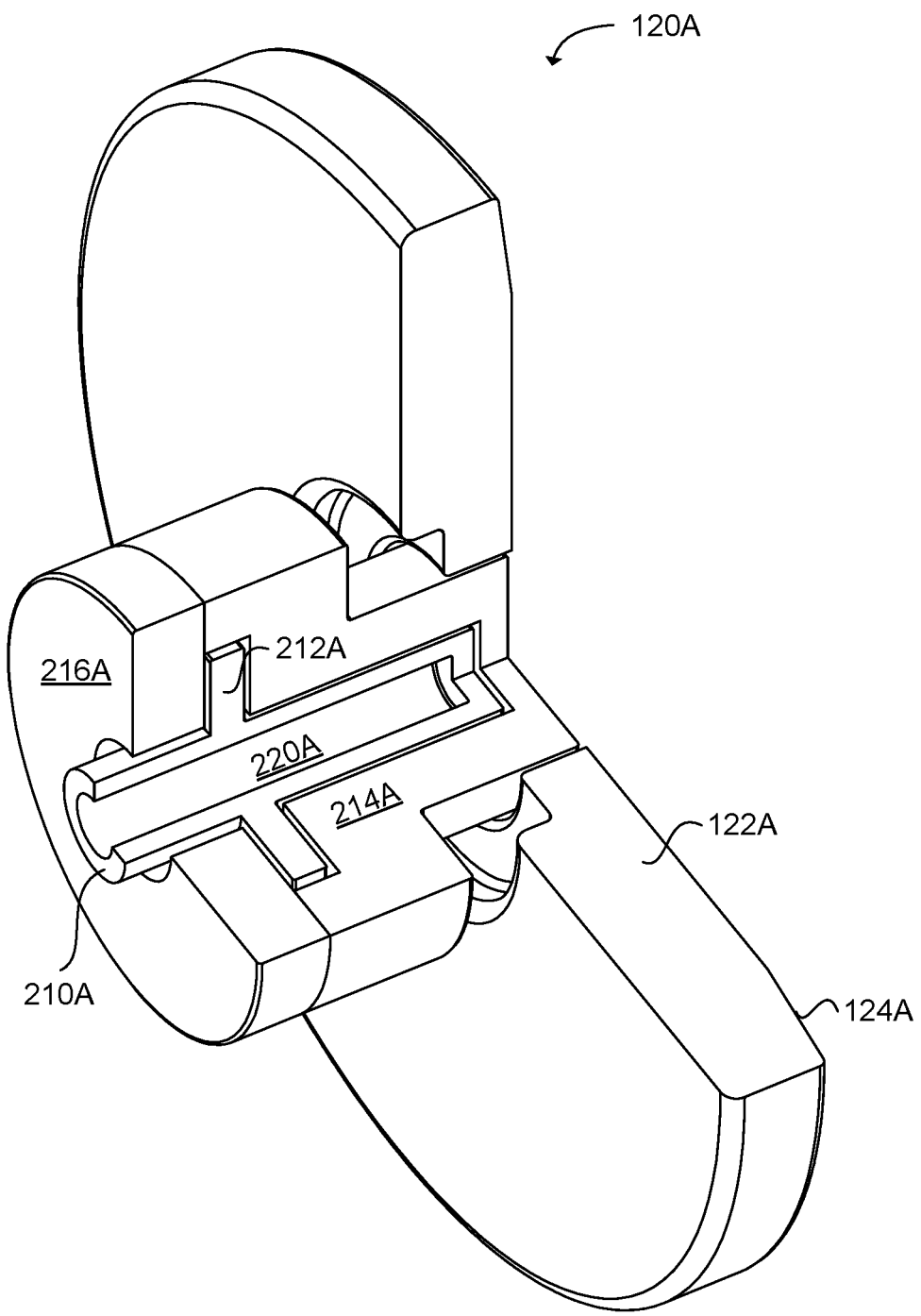
FIG. 2C illustrates a cross-sectional perspective view of an example anode assembly.

The liquid metal bearing (LMB) overcomes many of the challenges of the conventional bearing assemblies (e.g., bearing assemblies using tool steel ball bearings and tool steel raceways) used in x-ray tubes, which can be shown in the following drawings. FIGS. 2A, 2B, and 2C illustrate additional aspects of an anode assembly 120A of an example rotary anode type x-ray tube. The rotary-type anode assembly 120A is specifically designed to efficiently dissipate the heat generated at the focal track 124A so that only an acceptably low amount of heat conducts through the anode 122A to the bearing assembly 210A, 214A, and 216A. The anode assembly 120A includes a bearing assembly that includes rotatable components 214A and 216A (i.e., rotatable mount structures) and a stationary component 210A (i.e., fixed mount structure).

In the example shown in FIGS. 2A, 2B, and 2C, the stationary component includes a center shaft 210A (i.e., column or center mount structure) and the rotatable components includes a first sleeve 214A (i.e., first rotatable component) and a second sleeve 216A (i.e., second rotatable component) surrounding the shaft 210A. The shaft 210A is configured to attach to a frame, such as the insert, with the rotatable components 214A and 216A configured to rotate about the shaft 210A. The rotatable components 214A and 216A are mechanically coupled to the rotor and the anode 122A including a focal track 124A.

In other examples (not shown), the rotatable component is a center shaft and the stationary components are sleeves surrounding the shaft. The shaft can be coupled to the anode or the rotor.

Referring to FIG. 1, x-rays "x" are produced when high-speed electrons 'e" from the cathode 112 are suddenly decelerated by striking the focal track 124 on the anode 122. To avoid overheating anode 122 from the electrons "e", the rotor 128 and sleeves 214A and 216A rotate anode 122 and other rotatable components at a high speed (e.g., 55-300 Hz) about a centerline of the center shaft 210A. In some embodiments, the x-ray tube 100 can also include other cooling features to reduce the heat generated at the anode 122 and the cathode 112.

For example, referring back to FIGS. 2A, 2B, 2C, and 2D, the anode assembly 120A (or the bearing assembly) may also include a coolant cavity 220A (i.e., hollow, chamber, or passageway) in the shaft 210A for passage of liquid coolants or other heat transfer mediums to remove heat away from the anode 122A and the bearing assembly. The coolant may include a cooling fluid or liquid such as water, dielectric oil, ethylene glycol, propylene glycol, and the like, or may include a gas such as air, nitrogen, argon, and the like, is pressurized and caused to flow 224A into the center of center shaft 210A.

Figure 2D:
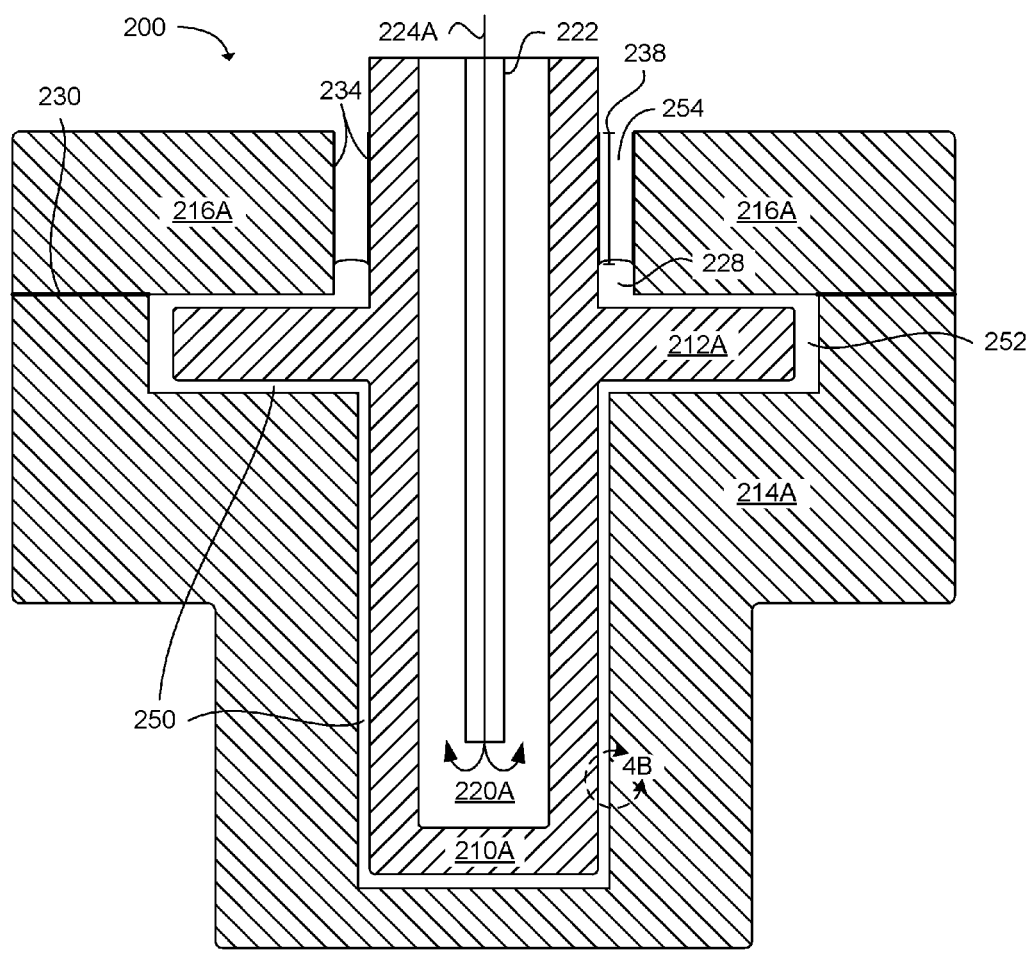
FIG. 2D illustrates a cross-sectional side view of an example liquid metal bearing assembly.

FIG. 2D illustrates a bearing assembly 200 for the anode assembly 120A of the example rotary anode type x-ray tube shown in FIGS. 2B and 2C. The shaft 210A includes a shaft flange 212A (i.e., radial projection) that is configured to axially limit the motion or translation of the first and second sleeves 214A and 216A. The coolant cavity 220A can include a coolant inlet 222 within the coolant cavity 220A to direct the flow 224A of the coolant in the shaft 210A.

The shaft 210A, the first sleeve 214A, and second sleeve 216A are separated from each other by various interfaces or gaps. The gaps facilitate assembly and disassembly of bearing components 210A, 214A, and 216A and operation of the bearing assembly. The interfaces or gaps can be stationary or movable (e.g., rotatable). The stationary interface 230 is formed between the surfaces of two components that are in a fixed position relative to each other, such as the first sleeve 214A and second sleeve 216A. The components are held in a fixed position relative to each other using a permanent or semi-permanent fastening or attachment mechanism, such as a bolt, a nut, a screw, other threaded fastener, a rivet, a pin, a clip, a clasp, a latch, a clamp, a braze, or a weld. The movable interfaces or gaps 250, 252, and 254 are formed between the surfaces of two components that move in relation to each other. The movable interfaces or gaps 250, 252, and 254 are referred to as a rotatable interface or gap when the two components or surfaces can rotate in relation to each other, such as an outer surface of the shaft 210A and an inner surface of the first and second sleeves 214A and 216A.

The different surfaces of a liquid metal bearing provide different functionalities, such as wetting and anti-wetting surfaces for assembly and proper operation. For example, bearing surfaces are wetted with a liquid metal whereas containment surfaces provide antiwetting capability. A bearing surface is a surface that functions to bear a load on the bearing assembly. A containment surface is a surface that functions to contain liquid metal.

In particular, the rotatable interfaces or gaps in the bearing assembly 200 can have different features and functions, such as a bearing interface or gap 250, a reservoir interface or gap 252, and a containment interface or gap 254. For example, the bearing interface or gap 250 includes a liquid metal 228 (FIG. 2D or 4C; i.e., liquid metal lubricant) to support the first and second sleeves 214A and 216A around the shaft 210A. The liquid metal 228 functions as a lubricant between the rotatable components 214A or 216A and stationary components 210A. The liquid metal 228 includes a metal that is in a liquid state at an operating temperature range of the bearing assembly 200. Gallium (Ga), indium (In), tin (Sn), or alloys of these metals are often used as the liquid metals, as these metals or alloys of these metals tend to be liquid at near room temperatures (e.g., 22° C.) and have low vapor pressure, at operating temperatures (e.g., >30° C.), to meet the rigorous high vacuum requirements of an x-ray tube. In one example, the operating temperature range of the bearing assembly 200 in the anode assembly 120 and the x-ray tube 100 is between 30° C. and 700° C. In another example, the operating temperature range of the bearing assembly 200 is between 150° C. and 400° C.

A liquid metal 228 may be used as a medium in a hydrodynamic bearing, which may be used as an alternative to another type of bearing (e.g., the ball bearing) or in addition to the other type of bearing. Some advantages of liquid metal bearings (LMBs) include a high load capability and a high heat transfer capability due to an increased amount of contact area as compared to a ball bearing. The LMBs also have low acoustic noise in operation.

Liquid metal bearings are typically fabricated in a small gap (e.g., 4-200 microns (μm)), formed between stationary components 210A and rotatable components 214A or 216A. The liquid metal 228 is positioned in the bearing gap 250 and prevents or reduces direct metal-to-metal contact from occurring. The size of the gap changes the force or friction characteristics of the bearing.

Liquid metals typically tend to be highly reactive and corrosive. A reactive substance is a substance that reacts with many common reagents, such as oxygen ($O_2$), which changes the composition of the substance or reagent. Reactivity tends to increase with an increase in temperature. For example, gallium reacts with hydrogen ($H_2$), pnictogen elements (chemical elements in group 15 of the periodic table), chalcogen compounds (chemical elements in group 16), and fluorinating agents. Corrosion is a natural process, which converts a metal to a more stable oxide, such as iron to iron oxide (e.g., rust). A corrosive substance is a substance that accelerates corrosion. Due to the highly reactive and corrosive properties of many liquid metals, the liquid metal 228 may react with a substrate metal (e.g., the shaft 210A or the sleeve 214A or 216A) or coating attached to substrate metal, thus consuming the liquid metal 228, the substrate metal, or coating and shortening the life of the bearing assembly. The liquid metal 228 can also be prone to migration within the bearing assembly and can readily migrate from the liquid metal's operating location in the small gap. If liquid metal migration occurs without being replenished, which can be difficult in vacuum sealed x-ray tubes, the bearing assembly can become starved of liquid metal 228, which can lead to metal-to-metal contact between rotatable components 214A or 216A and stationary components 210A, causing early life failure.

Figure 2E:
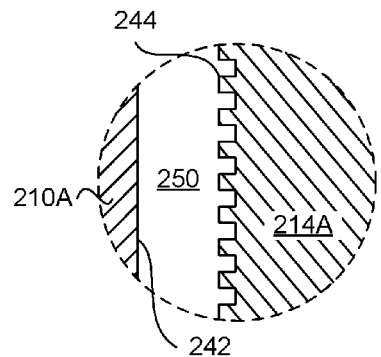
FIG. 2E illustrates an expanded view of an example bearing gap between two surfaces.

The surfaces of the stationary components 210A and the rotatable components 214A or 216A at the bearing interface 250 can have various patterns or textures, as shown by FIG. 2E. For example, FIG. 2E illustrates the stationary component 210A having a flat surface 242 and the rotatable component 214A having a grooved surface 244 (i.e., substantially square wave surface or U-shaped surface). In other examples, a non-flat surface (e.g., grooved surface 244) includes a one-dimensional (1D) pattern that continues in a second dimension of the surface or a two-dimensional (2D) pattern on the surface (e.g., spiral groove bearing). The 1D or 2D patterns and textures (e.g., a spiral groove) can facilitate or improve bearing functions or movement of the liquid metal 228. In other examples, the flat or grooved surface may be patterned on either the surfaces of the stationary components 210A or the rotatable components 214A or 216A. For example, the rotatable component 214A may have a flat surface and the stationary component 210A may have a grooved surface. In another example, the rotatable component 214A and the stationary component 210A may have flat surfaces. In another example, the rotatable component 214A and the stationary component 210A may have grooved surfaces.

Referring back to FIG. 2D, the reservoir interface or gap 252, which can also include liquid metal 228, can be a means or mechanism to provide a reservoir of liquid metal 228 to replenish some of the liquid metal 228 in the bearing gap 250. The reservoir gap 252 can have a spacing that is larger than the bearing gap 250, which bears the load of the rotatable components. In one example, the reservoir gap 252 is greater than 80 μm. The reservoir gap can include a relatively large cavity for the liquid metal 228 as long as the reservoir gap is configured to include, enclose, or confine the liquid metal 228. Some bearing assemblies may not include a reservoir gap. Although FIG. 2D shows the reservoir interface or gap 252 as a movable interface or gap, in other examples (not shown), the reservoir interface or gap can be a stationary interface or gap.

To minimize or reduce leakage of the liquid metal 228 from the bearing assembly 200 or reduce liquid metal migration, especially due to centrifugal forces on the liquid metal 228 in the bearing assembly, an antiwetting coating 234 is attached to surfaces of the rotatable components 214A or 216A and stationary components 210A at predefined locations. The antiwetting coating 234 is a structure or compound that repels the liquid metal 228 and minimizes creepage and migration of the liquid metal 228. The antiwetting coating 234 prevents liquid metal migration from desired locations within the bearing assembly (e.g., the bearing gap 250 or the reservoir gap 252) where the liquid metal 228 serves to maintain a separation between the stationary components 210A and the rotatable components 214A or 216A.

The antiwetting coating 234 can be applied to at least one surface at the containment interface or gap 230, 254. The containment interface or gap 230, 254 can be a means or mechanism to provide containment of the liquid metal 228 in the bearing assembly and reduce (or avoid) liquid metal migration outside the bearing gaps 250, and in some cases within the bearing gaps 250. The containment gap 230, 254 has a variable spacing that exceeds direct surface-to-surface contact, such as a stationary interface 230, and less than a maximum spacing (e.g., 150 μm) for liquid metal 228 containment. A containment region includes a portion of the gap or interface where at least one of the surfaces includes an antiwetting coating. The containment region can be included in a stationary interface 230 or a movable interface 254. The containment interface or gap 230, 254 is an interface or gap that includes the containment region. The surfaces of the stationary components (e.g., the first sleeve 214A and the second sleeve 216A) may have surface-to-surface contact (e.g., metal-to-metal contact or coating-to-coating contact) or a minimal gap (e.g., <40 μm, which may occur with variations in the surface) at the stationary containment interface 230. The surfaces of the components at the movable containment interfaces 254 can include a gap that allows for component movement with minimal to substantially no loading on the components (or minimal to substantially no loading on the surface of the components). The movable containment gap 254 can be large enough to substantially remove or eliminate loading or friction on the components and small enough to provide containment of the liquid metal 228 during operating conditions of the movable components (e.g., the bearing components). In one example, the containment gap 254 has a gap between 10 μm and 150 μm. In another example, the bearing gap 250 has a gap between 20 μm and 100 μm.

Figure 4C:
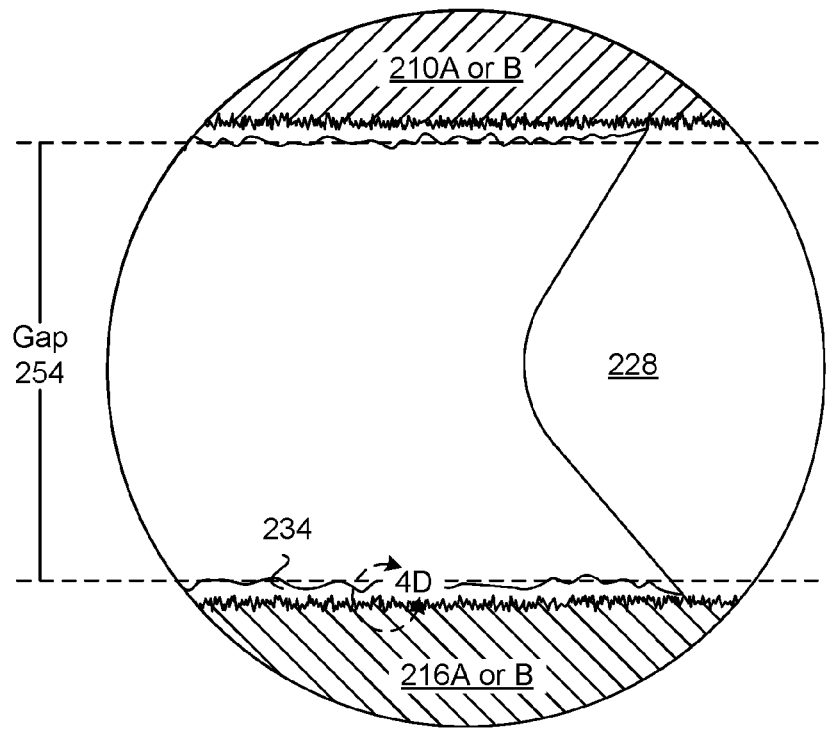
FIGS. 4C-4D illustrate expanded views of an antiwetting coating in a gap between two surfaces.
Figure 4D:
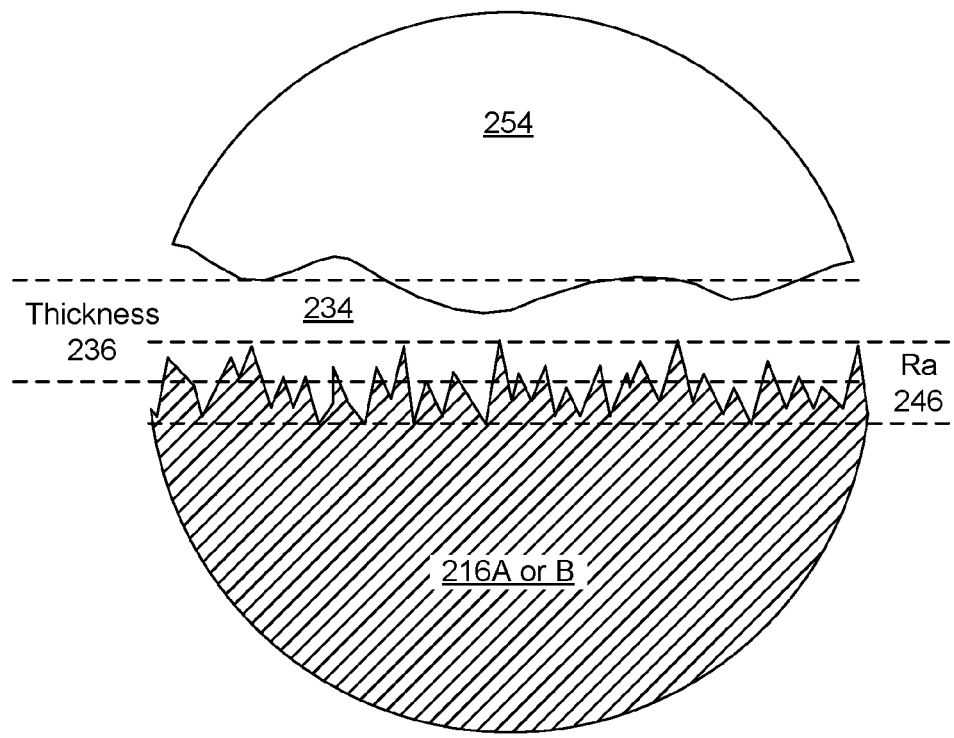

The antiwetting coating 234 has a length, width 238, and thickness 236 (FIG. 4D). The length of the antiwetting coating 234 typically covers the perimeter of containment. The width 238 of the antiwetting coating 234 depends on the forces (e.g., centrifugal forces or outward forces) on the liquid metal 228, the rotational speed of the shaft 210A, the material of the antiwetting coating 234, or the spacing of the containment gap 254. For shaft speeds of 55-300 Hz (e.g., of conventional rotating anodes) and rotatable containment gap 254 of less than 90 μm, an antiwetting coating width 238 that is greater than 12.7 millimeters (mm; 0.5 inches) can provide a sufficient thickness to contain the liquid metal 228. In another example, for shaft speeds of 55-300 Hz and rotatable containment gap 254 of less than 110 μm, an antiwetting coating width 238 that is greater than 25.4 mm (1 inch) can provide a sufficient thickness to contain the liquid metal 228.

Known antiwetting coatings include titanium oxide ($Ti_xO_y$ (e.g., $TiO_2$)) and aluminum oxide ($Al_2O_3$ or corundum), which are not prone to degradation due to contact with the liquid metal. $Ti_xO_y$ is a relatively soft material that is vulnerable to damage during processing. If damage in the coating occurs the components are typically re-processed, adding cost and time to the manufacturing process. If the damage is not detected, the damaged area can lead to early life failure of the bearing. Titanium nitride (TiN) is another antiwetting coating that has a greater hardness than, for instance, $Ti_xO_y$. As such, TiN can provide an effective antiwetting coating that is also scratch resistant and robust. However, TiN is prone to oxidation at elevated temperature, such as above 500° C. This oxidation of the TiN can occur even during hydrogen firing if the dew point of the hydrogen ($H_2$) gas is not low enough (e.g., <−40° C.). Volatile gallium oxide ($Ga_2O$) given off by the bearing has also been shown to cause oxidation of the TiN coated surfaces. As such, conversion of TiN to $Ti_xO_y$ can result in a material on the surface of the TiN that has a reduced hardness and drop in scratch resistance. Although TiN may be selected as an antiwetting coating because of its high hardness, such benefit can be lost if, during processing, oxidation of the TiN occurs.

Other antiwetting coatings have properties which make them more suitable for liquid metal bearings in high temperature application, such as X-ray tube applications. For example, chromium nitride (CrN), dichromium nitride ($Cr_2N$), chromium (III) oxide ($Cr_2O_3$), and titanium aluminum nitride (TiAlN) have high temperature resistance along with sufficient hardness, strong adhesion, strong chemical resistance or low chemical reactivity (e.g., inertness), and strong scratch resistance properties.

Table 1 (i.e., FIG. 3) illustrates a summary of some of the properties for TiN, CrN, $Cr_2N$, $Cr_2O_3$, TiAlN, $TiO_2$, titanium carbon nitride (TiCN), and $Al_2O_3$. The properties of TiN, $TiO_2$, TiCN, and $Al_2O_3$ are provided for comparison. Some of the properties include hardness, abrasion resistance, adhesion, corrosion resistance, chemical resistance or chemical reactivity (e.g., inertness), temperature resistance, thermal conductivity, electrical conductivity, friction coefficient, and coating density and continuity. More details of the properties summarized in Table 1 are provided later in this disclosure.

FIGS. 2A, 2B, 2C, and 2D illustrate the different types of gaps on one bearing assembly 200 for a rotary anode assembly 120A. FIGS. 4A and 4B illustrate the different types of gaps on another bearing assembly for another rotary anode assembly 120A. The anode assembly 120B includes a bearing assembly that includes rotatable components (i.e., a first sleeve 214B and a second sleeve 216B) surrounding a stationary component (i.e., a shaft 210B). The rotatable components 214B and 216B are mechanically coupled to the rotor and the anode 122B including a focal track 124B. The anode assembly 120B (or the bearing assembly) also includes a coolant cavity 220B that extends through the shaft 210B for passage of liquid coolants or other heat transfer media to remove heat away from the anode 122B and the bearing assembly. The coolant flows 224B from a coolant inlet on one end of the coolant cavity 220 to a coolant outlet on another end of the coolant cavity 220 of the shaft 210B. The anode assembly 120B includes stationary interfaces 230 and movable (e.g., rotatable) interfaces or gaps 250 and 254, which can also be categorized as bearing gaps 250 and containment interfaces or gaps 230 and 254.

FIG. 4C illustrates an expanded view of a containment interface of FIG. 4B showing the antiwetting coating 234 on two surfaces of the containment gap 254 bordering the bearing interface 250 (or reservoir interface 252). The antiwetting coating 234 is attached to each surface of the substrate (e.g., the shaft 210B and the second sleeve 216B). The antiwetting coating 234 is shown repelling the liquid metal 228.

FIG. 4D illustrates an expanded view of the surface of one of the substrates (e.g., the second sleeve 216B) in FIG. 4C, which shows a surface roughness (Ra) 246 of the substrate 216B and an average coating thickness 236 on the surface. At a microscopic view, even a relatively flat surface can appear to have a rough surface with ridges (or peaks) and valleys. The surface roughness 246, often shortened to roughness, is a component of surface texture. The amplitude or height of the surface roughness 246 can be characterized as the difference between the peaks and valleys. The surface roughness 246 can determine the continuity of the antiwetting coating 234. To provide adequate containment of the liquid metal 228 or satisfactory wear resistance properties of the antiwetting coating 234, the thickness 236 of the antiwetting coating 234 can vary based on the surface roughness 246. As the antiwetting coating 234 has a variable thickness 236 throughout the applied surface, the antiwetting coating thickness 236 refers to an average thickness. In one example, the antiwetting coating thickness 236 is between 1.5 times and 10 times the surface roughness 246. For example, if the surface roughness 246 is 500 nanometers (nm), the antiwetting coating thickness 236 can be between 750 nm and 5 μm. In one example, even with a relatively flat surface (e.g., Ra<250 nanometers (nm)), the antiwetting coating thickness 236 is at least 200 nm to provide adequate coating continuity (e.g., when microcavities and microparticles occur), wear properties, or liquid metal repellant properties. If the antiwetting coating thickness 236 is too thin, the antiwetting coating 234 can lose its antiwetting properties during operation, especially at high temperatures. In other example, if the antiwetting coating 234 is too thick, the antiwetting can spall or flake off the substrate. The thickness 236 can also depend on the antiwetting coating material used and its properties.

Figure 5:
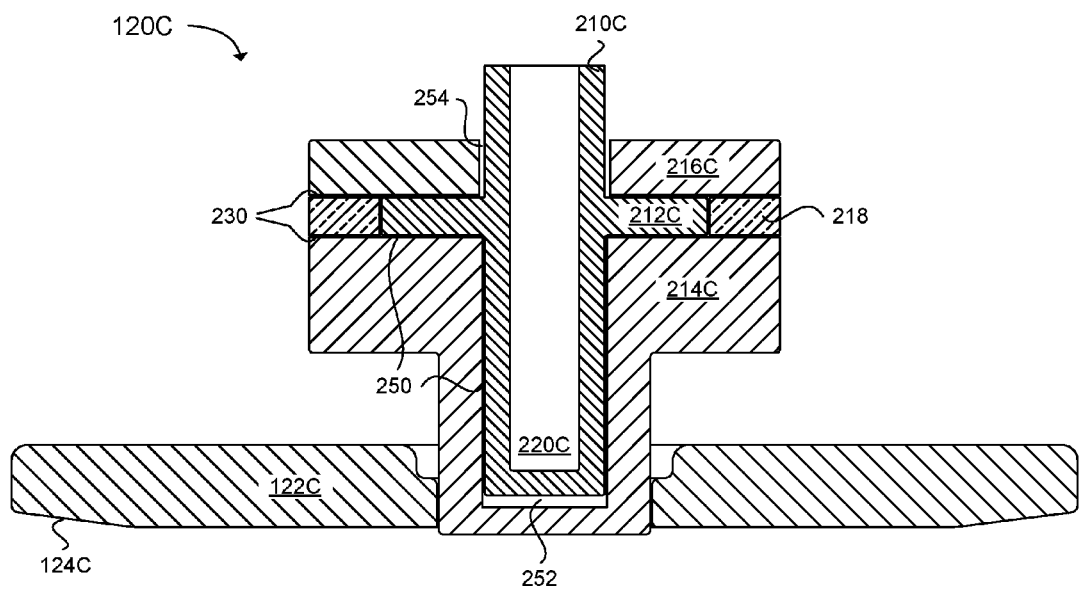
FIGS. 5-6 illustrate cross-sectional views of various bearing assemblies.
Figure 6:
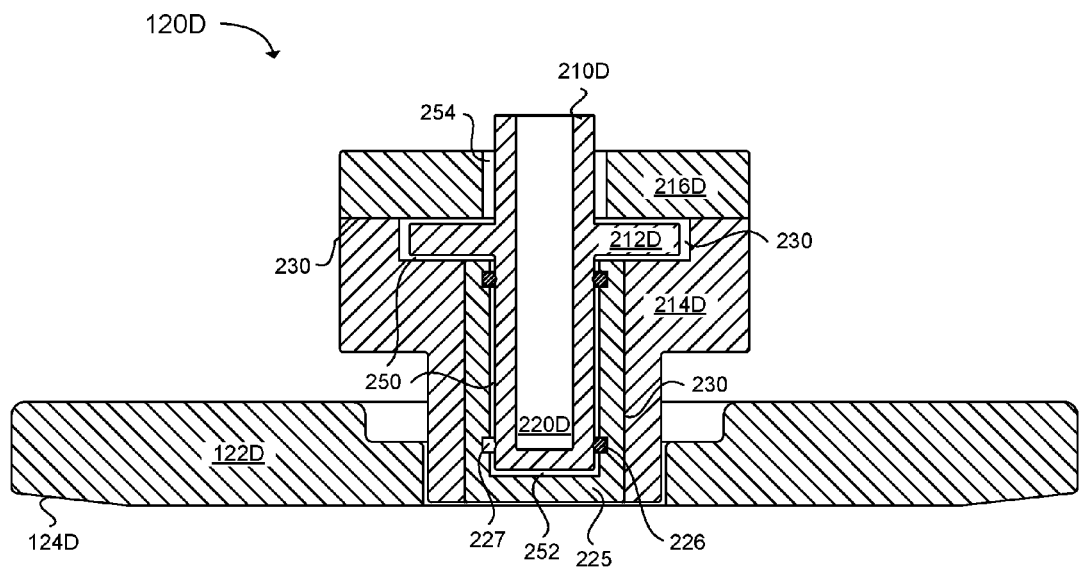

FIGS. 5-6 illustrate cross-sectional views of other anode assemblies 120C-D including bearing assemblies with bearing gaps 250, reservoir gaps 252, and containment gaps 230 and 254. FIG. 5 includes three rotatable components: a first sleeve 214C, a second sleeve 216C, and a third sleeve 218. The third sleeve 218 (i.e., third rotatable component) surrounds the shaft flange 212C. The rotatable components 214C, 216C, and 218 are mechanically coupled to the rotor and the anode 122C including a focal track 124C. The anode assembly 120C (or the bearing assembly) also includes a coolant cavity 220C in the shaft 210C for passage of liquid coolants or other heat transfer mediums to remove heat away from the anode 122C and the bearing assembly. The anode assembly 120C includes stationary interfaces 230 and movable (e.g., rotatable) interfaces or gaps 250, 252, and 254, which can also be categorized as bearing gaps 250, reservoir gaps 252 and containment interfaces or gaps 230 and 254. In other examples (not shown), the bearing assembly can have multiple rotatable components or multiple stationary components.

FIG. 6 illustrates an anode assembly 120D (or the bearing assembly) that uses ball bearings 226 and bearing raceways 227 (i.e., bearing race; e.g., tool steel ball bearing or tool steel raceways) in conjunction with liquid metal. The anode assembly 120D includes at least one ball bearing 226. The anode assembly 120D includes a bearing assembly that includes rotatable components (i.e., a first sleeve 214D, a second sleeve 216D, and a bearing insert 225) surrounding a stationary component (i.e., a shaft 210D). The bearing insert 225 assists with the insertion of the ball bearings 226 into the bearing assembly. The bearing insert 225 can be mechanically coupled or fixed to the first sleeve 214D. The raceway 227 is shown as a groove in both the rotatable component (i.e., the bearing insert 225) and the stationary component (i.e., the shaft 210D). In other examples, the bearing raceway can be formed in the rotatable component or the stationary component. The rotatable components 214D and 216D are mechanically coupled to the rotor and the anode 122D including a focal track 124D. The anode assembly 120D (or the bearing assembly) also includes a coolant cavity 220D in the shaft 210D for passage of liquid coolants or other heat transfer media to remove heat away from the anode 122D and the bearing assembly. The anode assembly 120D includes stationary interfaces 230 and movable (e.g., rotatable) interfaces or gaps 250, 252, and 254, which can also be categorized as bearing gaps 250, reservoir gaps 252 and containment interfaces or gaps 230 and 254. Although ball bearings 226 and bearing raceways 227 are shown in the liquid metal bearing assembly, in other examples (not shown), other types of bearings may also be used with liquid metal.

Example Liquid Metal Container

Figure 7:
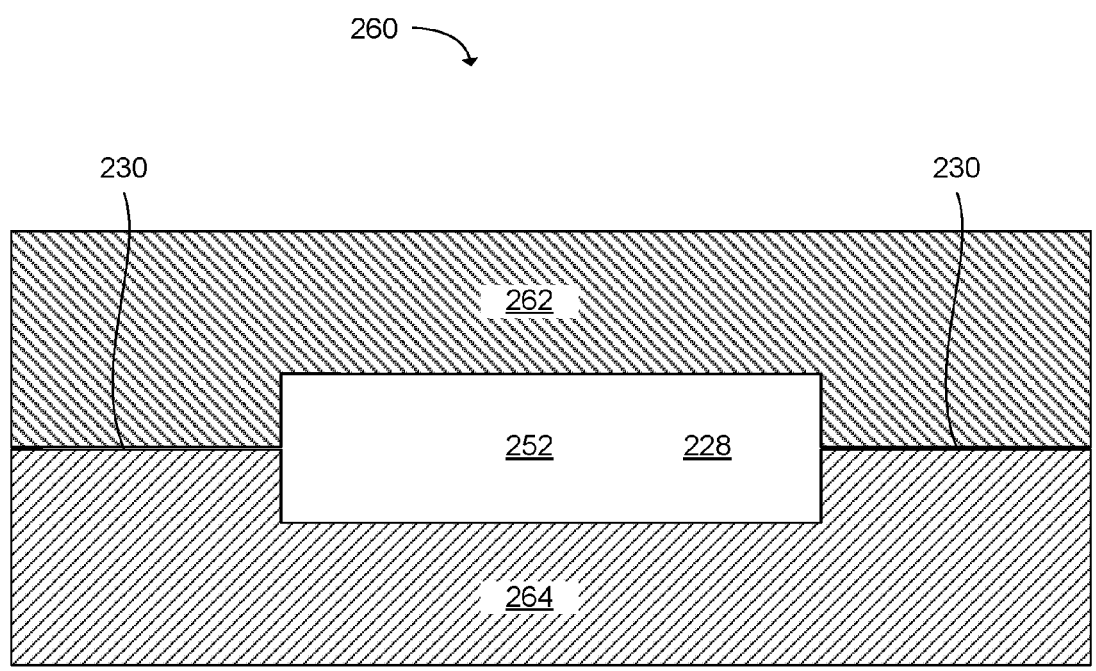
FIG. 7 illustrates cross-sectional view of a liquid metal container.

Although the antiwetting coating is beneficial for bearing assemblies and x-ray tubes, the antiwetting coating may also be used more generally in other applications to contain or prevent leakage of liquid metal between metal interfaces. FIG. 7 illustrates a cross-sectional view of a liquid metal container 260 that includes a first enclosure member 262, a second enclosure member 264, and a liquid metal 228 positioned within a gap (e.g., reservoir gap 252) between the first enclosure member 262 and the second enclosure member 264. The reservoir gap 252 can form at least a portion of a cavity in the container 260. The first enclosure member 262 includes a first substrate with a first surface. The second enclosure member 264 including a second substrate with a second surface. The first enclosure member 262 is fixed in position relative to the second enclosure member 264 such that the gap is formed between the first surface and the second surface. The container 260 can at least partially contain the liquid metal 228 using an antiwetting coating attached to the first surface, the second surface, or both (e.g., at the stationary interface 230). The antiwetting coating 234 includes chromium nitride (CrN), dichromium nitride ($Cr_2N$), chromium (III) oxide ($Cr_2O_3$), or titanium aluminum nitride (TiAlN).

Method of Forming Antiwetting Coating

Figure 8:
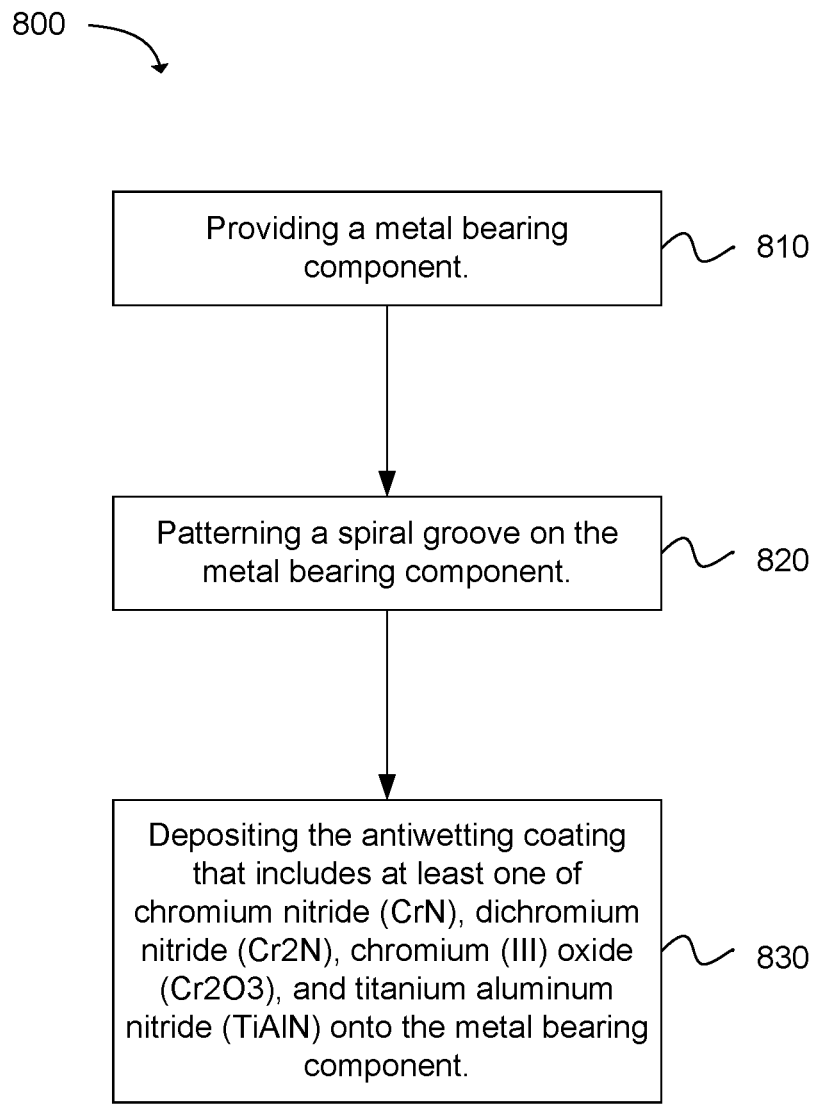
FIG. 8 is flowchart illustrating an example of a method of forming an antiwetting coating on a metal substrate of a bearing component.

The flowchart shown in FIG. 8 illustrates a method 800 of forming an antiwetting coating on a metal substrate of a metal bearing component. The method includes the step of providing a metal bearing component, as in step 810. The step of patterning a spiral groove on the metal bearing component follows, as in step 820. The next step of the method includes depositing the antiwetting coating that includes chromium nitride (CrN), dichromium nitride ($Cr_2N$), chromium (III) oxide ($Cr_2O_3$), or titanium aluminum nitride (TiAlN) onto the metal bearing component, as in step 830. The antiwetting coating can be deposited with a thickness between 200 nm and 2 μm.

The patterning of a spiral groove on the metal bearing component (i.e., step 820) can occur before or after the deposition of the antiwetting coating (i.e., step 830). The patterning of the spiral groove can be formed using various fabrication techniques, such as etching, machining, laser machining, or mechanical grooving.

Prior to depositing the antiwetting coating, the surface of the metal bearing component can be smoothed to less than a specified surface roughness (Ra). Having a surface roughness below a specified value allows a minimal thickness of the antiwetting coating to provide adequate antiwetting properties for the metal bearing component. Examples of smoothing the surface include grinding, polishing, lapping, abrasive blasting, honing, electrical discharge machining (EDM), milling, lithography, industrial etching/chemical milling, or laser texturing. In one example, the surface is smoothed to or has a surface roughness less than 250 nm before depositing the antiwetting coating. In another example, the surface is smoothed to or has a surface roughness less than 150 nm before depositing the antiwetting coating.

The antiwetting coating can be deposited using a variety of deposition processes, such as physical vapor deposition (PVD), sputtering, ion beam enhanced deposition (IBED), chemical vapor deposition (CVD), and atomic layer deposition (ALD). PVD is a conventional technique for depositing antiwetting coatings. PVD includes a variety of vacuum deposition methods which can be used to produce thin films. PVD uses physical process, such as heating or sputtering, to produce a vapor of material, which is then deposited on the object of substrate that is to be coated. Sputtering is a process whereby particles are ejected from a solid target material due to bombardment of the target by energetic particles, which is often used for thin-film deposition. For example, sputter deposition is a physical vapor deposition (PVD) method of thin film deposition by sputtering, that involves ejecting material from a "target" that is a source onto a "substrate," such as a metal bearing component. In reactive sputtering (e.g., reactive arc sputtering), the deposited film is formed by chemical reaction between the target material and a gas which is introduced into the vacuum chamber. The composition of the film can be controlled by varying the relative pressures of the inert and reactive gases.

Due to the dissimilar materials used in the substrate and the antiwetting coating, the antiwetting coating can expand and contract relative to the substrate due to thermal expansion. For example, when the temperature of the bearing component (e.g., the substrate and the antiwetting coating) increases, the density of the thin film of the coating increases and the coating may crack if coated at a low temperature (e.g., ambient temperature or room temperature) and then operated at a high temperature (e.g., greater than 300° C.). Increasing or decreasing the coating temperature (i.e., the temperature when the antiwetting coating is deposited) can improve the adhesion and continuity of the film and reduce cracking of the coating.

Sputtering is typically performed in a deposition chamber (e.g., sputtering chamber) at an elevated temperature, such as temperatures exceeding 370° C. In some examples, sputtering may not occur at lower temperatures (e.g., less than 250° C.). As indicated, the antiwetting coating may have a substantially different thermal expansion coefficient from the underlying substrate, which causes the antiwetting coating to expand and contract at a different rate from the substrate with changes in temperature. The thermal expansion coefficient describes the size of an object with a change in temperature. These differences in thermal expansion coefficients can adversely affect the adhesion of the antiwetting coating to the substrate as the metal bearing heats up and cools down. Because the deposition temperature during sputtering occurs at a temperature is closer to the operational temperature, (e.g., 300-400° C.), the interface of the antiwetting coating and the substrate may experience stresses due to thermal expansion when the metal bearing is brought back to an ambient temperature (e.g., 25° C.), which is at the greatest temperature differential from the deposition temperature (e.g., >370° C.−25° C.=>345° C.).

Other techniques for depositing antiwetting coatings may reduce the temperature of the deposition of the antiwetting coating, such as a temperature less than 350° C., less than 250° C., less than 200° C., or less than 150° C. For example, ion beam enhanced deposition (IBED) may be used to attach the antiwetting coating onto the substrate (e.g., metal bearing component) at a much lower temperature (e.g., below 100° C.) than conventional sputtering. As a result, the deposition chamber (e.g., vacuum chamber) can be set to a temperature that minimizes the stresses due to thermal expansion between the antiwetting coating and the substrate while still providing good adhesion of the antiwetting coating to the substrate.

For example, if the operational temperature of the metal bearing in an x-ray device is 425° C. and the ambient temperature of the metal bearing is 25° C. in a non-operational or turned-off state, then the temperature of the deposition chamber can be set to a temperature, such as 225° C., between the operational temperature and the ambient temperature (e.g., 10% and 90%, 20% and 80%, 30% and 70%, 40% and 60% of the operational temperature above the ambient temperature). Setting a temperature of the deposition chamber at an approximate midpoint between the operational temperature and the ambient temperature can reduce the stresses due to thermal expansion between the antiwetting coating and the substrate in a single direction and improve adhesion and wear resistance.

IBED, also referred to as ion beam assisted deposition (IBAD), is thin film deposition technique that provides a high degree of control over coating nanostructure, good adhesion, and precision and uniformity in the coating. Film-substrate adhesion in IBED is achieved without the external application of heat, processing temperatures can be held below 100° C., and coatings can be deposited on three-dimensional mechanical components. IBED is a physical, non-equilibrium coating process implemented in a high vacuum environment by the simultaneous bombardment of a growing film with an independently controllable beam of energetic particles. The growing film or coating is generated either by vacuum evaporation or ion beam sputtering. IBED uses an independent beam of particles (e.g., either an inert species, such as Ne+, Ar+, or Kr+, or a reactive species such as N+ or O+) from an augmenting beam combined with a flux of an evaporant coating (e.g., the metallic component of the antiwetting coating) from an evaporator. For example, the surface to be coated is first illuminated with a flux of high-energy ions (i.e., inert or reactive ions) that is initially used to remove surface oxides and other contaminants. Once the surface is cleaned, the high-energy ion flux is maintained and then a flux of coating atoms is then directed simultaneously at the surface to be coated. The high-energy ions are used to mix the initial few atomic layers of the coating material into the surface being coated. The mixed initial atomic layers of the coating material form an alloyed bond layer in the surface that promotes adhesion of the coating and allows coatings of a variety of materials to be applied to the substrate material without the need of an intermediate bonding layer. Once the alloyed layer is formed properly, the coating is then allowed to grow out from the alloyed layer. The stronger adhesion provides better wear resistance and thin film coating uniformity to contain the liquid metal. Not only does IBED reduce the processing temperature during deposition, but IBED can also provide faster processing times than other deposition processes, such as chemical vapor deposition (CVD) and atomic layer deposition (ALD).

CVD is a chemical process used to produce thin films. In typical CVD, the substrate is exposed to one or more volatile precursors, which react or decompose on the substrate surface to produce a desired deposit. Often, volatile by-products are also produced, which can be removed by gas flow through the deposition chamber (e.g., reaction chamber).

ALD is a thin film deposition technique that is based on the sequential use of a gas phase chemical process. ALD reactions typically use two chemicals, called precursors. These precursors react with the surface of a material one at a time in a sequential, self-limiting, manner. Through the repeated exposure to separate precursors, a thin film is slowly deposited.

After the antiwetting coating is deposited on the specified areas of the substrate (e.g., the metal bearing component), the antiwetting coating may be oxidized to provide an antiwetting coating with a harder surface or another layer with different wear properties. For example, the antiwetting coating with CrN or $Cr_2N$ can include an oxide layer of chromium nitrosyl (CrNO), chromium nitrosyl complex, chromium nitrate ($CrNO_3$), chromium(II) nitrate $Cr(NO_3)_2$, or chromium(III) nitrate $Cr(NO_3)_3$. The antiwetting coating with TiAlN can have include an oxide layer of titanium oxide ($TiO_2$), aluminum oxide ($Al_2O_3$), or titanium aluminum oxide ($Ti_xAl_yO_z$ where x, y, and z represent a number of atoms for Ti, Al, and O, respectively). In one example, the oxide layer can comprise at least 5% of the antiwetting coating thickness. In another example, the oxide layer can comprise at least 10% of the antiwetting coating thickness. In still another example, the oxide layer can comprise at least 20% of the antiwetting coating thickness. The oxide layer may be generated or grown by hydrogen dry firing with a minute amount of oxygen present.

In another example, the metal bearing component with the antiwetting coating can be assembled with another metal bearing component (e.g., a second metal bearing component) into a bearing assembly. The second metal bearing may also include the antiwetting coating. The metal bearing component may fit into the second metal bearing component so that gap is formed between the metal bearing component and the second metal bearing component. The liquid metal may be inserted into the gap before or after the metal bearing component and the second metal bearing component are assembled together. U.S. Pat. No. 5,298,293 entitled, "Method of Manufacturing a Rotary Anode Type X-Ray Tube," which is incorporated by reference in its entirety, discloses at least one method for inserting liquid metal into a bearing assembly. Other processes for inserting the liquid metal into the bearing assembly may also be used.

Antiwetting Coating Properties

As previously provided, Table 1 (i.e., FIG. 3) illustrates some hard coatings that may be used as antiwetting coatings, which include TiN, CrN, $Cr_2N$, $Cr_2O_3$, TiAlN, $TiO_2$, TiCN, and $Al_2O_3$. The antiwetting coatings shown in Table 1 have properties which make them suitable for liquid metal bearings, and more specifically X-ray tube applications. For example, chromium nitride (CrN), dichromium nitride ($Cr_2N$), chromium (III) oxide ($Cr_2O_3$), and titanium aluminum nitride (TiAlN) have high temperature resistance along with sufficient hardness, strong adhesion, strong chemical resistance or low chemical reactivity (e.g., inertness), and strong scratch resistance properties. The properties of TiN, $TiO_2$, TiCN, and $Al_2O_3$ are provided for comparison.

Other hard coatings that may also be used as antiwetting coatings that are not listed in Table 1 are silicon carbide (SiC; carborundum), silicon dioxide ($SiO_2$; silica), and zirconium nitride (ZrN). SiC, $SiO_2$, and ZrN have anti-wetting characteristics for gallium and gallium alloys along with robust wear and corrosion resistance properties.

Some of the properties in Table 1 include hardness, abrasion resistance, adhesion, corrosion resistance, chemical resistance or chemical reactivity (e.g., inertness), temperature resistance, thermal conductivity, electrical conductivity, friction coefficient, coating density and continuity. The properties summarized in Table 1 are only estimates and approximations used for comparison of materials and can vary based on a number of factors, such as deposition processes, substrate material, material temperature, surface roughness, and coating thickness.

The various antiwetting coatings can have different percentages (%) of elements in the composition. For example TiAlN (or aluminum titanium nitride (AlTiN) for compositions with a higher of Al than Ti), can have different compositions based on the percentage of titanium relative to aluminum, such as Ti50Al50N (i.e., 50% Ti to 50% Al), Al55Ti45N (i.e., 55% Al to 45% Ti), Al60Ti40N (i.e., 60% Al to 40% Ti), and Al66Ti34N (i.e., 66% Al to 34% Ti). Other antiwetting coatings may have differences in percentages (%) of elements in the composition.

Referring back to properties in Table 1, hardness is a measure of how resistant solid matter is to various kinds of permanent shape change (i.e., plasticity) when a compressive force is applied. A lesser compressive force may cause a temporary change in shape referred to as elasticity or stiffness and a greater compressive force can cause a fracture, which occurs when the matter breaks into two or more pieces. Macroscopic hardness is generally characterized by strong intermolecular bonds, but the behavior of solid materials under force can be complex. Therefore, different types of measurements are used to assess the different properties of hardness, such as scratch hardness, indentation hardness, and rebound hardness. Hardness measurements include Mohs scale of hardness, absolute hardness, Brinell scale, and Vicker hardness ($H_V$). Other types of hardness measurements also exist.

The Mohs scale of hardness is a qualitative ordinal scale that characterizes the scratch resistance of various minerals through the ability of a harder material to scratch a softer material. For example, corundum ($Al_2O_3$ with Mohs hardness of approximately 9 and an absolute hardness of approximately 400) is twice as hard as topaz ($Al_2SiO_4(OH^-, F^-)_2$ with Mohs hardness of approximately 8 and an absolute hardness of approximately 200), but diamond (C with Mohs hardness of approximately 10, an absolute hardness of 1600, and a Knoop hardness of 7000) is four times as hard as corundum. The Mohs hardness of TiN and $Al_2O_3$ is approximately 9. The Mohs hardness of CrN is approximately 7, and the Mohs hardness of $Ti_xO_y$ is approximately 5-6.

The Brinell scale characterizes the indentation hardness of materials through the scale of penetration of an indenter, loaded on a material test-piece. The Vickers hardness test is an alternative to the Brinell method to measure the hardness of materials. The Vickers test is often easier to use than other hardness tests since the calculations are independent of the size of the indenter, and the indenter can be used for all materials irrespective of hardness. The basic principle, as with all common measures of hardness, is to observe the questioned material's ability to resist plastic deformation from a standard source. The Vickers test can be used for most metals and has one of the widest scales among hardness tests. The unit of hardness given by the test is known as the Vickers Pyramid Number (HV), Diamond Pyramid Hardness (DPH), or kilograms per millimeter squared (kg/$mm^2$). Vickers hardness for TiN is approximately 2000 to 2400 HV. Vickers hardness for CrN is approximately 1100 to 1800 HV. Vickers hardness for $Cr_2N$ is approximately 1700 to 3000 HV. Vickers hardness for $Cr_2O_3$ is approximately 2500 to 3000 HV. Vickers hardness for TiAlN, specifically Al66Ti34N, is 2600 to 3400 HV.

The Knoop method was developed as an alternative to the Vickers method, in large part to overcome the cracking in brittle materials, but also to facilitate the possibility of testing thin layers. The Vickers test or measurement in many cases can be substituted with the Knoop test or measurement.

Abrasion resistance is material ability to resist scuffing, scratching, wearing down, marring, or rubbing away. The resistance of materials and structures to abrasion can be measured by a variety of test methods and standards, usually in comparison to other materials. One standardized measurement for abrasion resistance is an abrasion rate. In one example, measurements are obtained using a Taber Abraser that includes resilient rollers impregnated with 50-micron diameter alpha-phase aluminum oxide grits, which is then applied to disks coated with the tested material. One cycle of the test is one rotation of the disk. For TiN deposited by PVD or IBED, the abrasive wear rate was 0.02 microns per 10,000 cycles. For CrN deposited by PVD, the abrasive wear rate was 0.03 microns per 10,000 cycles. For $Cr_2N$ deposited by IBED, the abrasive wear rate was 0.12 microns per 10,000 cycles. For hard chrome (Cr), the abrasive wear rate was 0.4 microns per 10,000 cycles. The abrasive wear rate for TiCN is less than the abrasive wear rate for TiN.

Adhesion is the tendency of dissimilar particles or surfaces to cling to one another. Adhesion can be measured by a variety of test methods and standards. For instance, the American Society for Testing and Materials (ASTM) provides classifications for materials based on their adhesive properties, such as cross-cut test, scrape adhesion, and tape pull-off test (e.g., ASTM D3359). The adhesion ASTM class can also correspond to an adhesion International Organization for Standardization (ISO) class. The cross-cut test method provides a procedure for assessing the resistance of coatings to separate from substrates when a right angle lattice pattern is cut into the coating, penetrating through to the substrate. In the scrape adhesion test, a rounded stylus or loop with increasing amounts of weight is applied to the coating until the coating is removed from the substrate surface. The ASTM scratch adhesion test can be a tape test. In the pull-off test, adhesion of a single coating or a multi-coat system of a material is assessed by measuring the minimum tensile stress needed to detach or rupture the coating in a direction perpendicular to the substrate. The pull-off method maximizes tensile stress as compared to the shear stress applied by other methods, such as scratch adhesion or abrasive methods (e.g., Taber Abaser). The results between tensile stress (e.g., cross-cut test or pull-off test) and shear stress may not be comparable.

In ASTM class 5B (or ISO class 0), the edges of the cuts (from the cross-cut test) are smooth and none of the squares of the lattice is detached (i.e., no flaking off and very good adhesion). In ASTM class 4B (or ISO class 1), a detachment of small flakes of the coating occurs at the intersections of the cuts, and a cross-cut area not significantly greater than 5% is affected. ASTM classes 3B, 2B, 1B, and 0B (or ISO classes 2, 3, 4, and 5, respectively) have less adhesive properties than ASTM class 4B. TiN, CrN, $Cr_2N$, and TiAlN have a 5B ASTM classification with most metal substrates used in X-ray tube applications (e.g., Fe alloys and Mo). $Cr_2O_3$ has a 5B or 4B ASTM classification. In the scratch adhesion test or the tape pull-off test CrN delaminates at approximately 6.9±0.2 Newtons (N) whereas TiN delaminates at approximately 5.8±0.3 N.

The antiwetting coating material, such as CrN, $Cr_2N$, $Cr_2O_3$, or TiAlN, is compatible with and provides good adhesion to metal components of the bearing assembly (e.g., substrates). The bearing components can be formed of a metal, such as an iron (Fe) alloy or a refractory metal alloy. The iron alloys can include stainless steel. Refractory metals, such as niobium (Nb), molybdenum (Mo), tantalum (Ta), tungsten (W), and rhenium (Re), are a class of metals that are extraordinarily resistant to heat, corrosion, and wear. Partly due to the high melting point, refractory metals are stable against creep deformation to very high temperatures.

Corrosion resistance is a material's (e.g., metal's) ability to resist oxidation. The materials most resistant to corrosion are those for which corrosion is thermodynamically unfavorable, such as chromium. Some materials, such as aluminum stainless steel, and titanium, spontaneously develop a thin film of oxides, also known as a passive layer or passivation film, on the metal's surface that acts as a barrier to further oxidation. TiN, CrN, $Cr_2N$, $Cr_2O_3$, TiAlN, and TiCN have a high resistance to corrosion.

Chemical reactivity is a somewhat vague concept in chemistry that relates to a material's chemical stability and chemical compatibility with other substances and compounds, which can change with temperature, pressure, and the presence of catalyst. Chemical reactivity can refer to a substance's decomposition, formation of new substances, or a rate of reaction. Inert describes a substance that is not chemically reactive, such as the nobles gases. TiN is inert. A substance's (e.g., coating's) chemical reactivity can be discussed in reference to a particular chemical compound or group of chemical compounds, such as gallium. CrN, $Cr_2N$, $Cr_2O_3$, TiAlN, and TiCN are resistance to gallium and gallium alloys (e.g., GaInSn).

Temperature resistance refers to a temperature when a material (e.g., coating) can lose adhesion to a substrate or delaminate from the substrate. For example, when the coating exceeds the temperature resistance temperature, the coating can lose its adhesion, such as scale spallation. Alternatively or additionally, intense oxidation, accelerated oxidation, or oxide evaporation may start occurring above the temperature resistance temperature. Temperature resistance may also be referred to as oxidation resistance or temperature oxidation resistance. TiN has a temperature resistance up to approximately 500-600° C. CrN and $Cr_2N$ have a temperature resistance up to approximately 700° C. TiAlN has a temperature resistance up to approximately 800° C., and $Cr_2O_3$ has a temperature resistance up to approximately 1100° C. TiCN has a temperature resistance up to approximately 400° C.

Thermal conductivity is the property of a material to conduct heat, usually in the units of watts per meters-Kelvin (W/(m·K)). A greater value indicates a greater ability to conduct heat, which can be beneficial for dissipating heat from a bearing assembly in an X-ray tube application. The thermal conductivity of TiN is approximately 11.9-19.2 W/(m·K). The thermal conductivity of CrN is approximately 11.7 W/(m·K), and the thermal conductivity of Cr2N is greater than 10 W/(m·K). The thermal conductivity of $Cr_2O_3$ is approximately 1.7-17 W/(m·K), and the thermal conductivity of TiAlN is greater than the thermal conductivity of TiN. The thermal conductivity of $Al_2O_3$ is approximately 15.9-35 W/(m·K).

Electrical resistivity or specific electrical resistance quantifies how strongly a given material opposes the flow of electric current, usually in the units of ohm meters (Ω·m). The electrical conductivity or specific conductance (i.e., the reciprocal of electrical resistivity or specific electrical resistance) measures a material's ability to conduct an electric current. The electrical resistivity of TiN is approximately 30-70 μΩ·cm, and the electrical resistivity of Cr2N is approximately 79-89 μΩ·cm. The electrical resistivity of CrN is approximately 1.5-12 mΩ·m. The electrical resistivity of $Cr_2O_3$ is approximately $15 \times 10^7$ Ω·m, and the electrical resistivity of TiAlN is greater than the electrical resistivity of TiN. The electrical resistivity of $Al_2O_3$ is approximately $10^{13-15}$ Ω·m.

Friction is the force resisting the relative motion of solid surfaces, fluid layers, and material elements sliding against each other. The friction coefficient (often symbolized by the Greek letter μ) or coefficient of friction (COF) is a dimensionless scalar value which describes the ratio of the force of friction between two bodies and the force pressing them together. A lower friction coefficient can indicate less wear and heat generated on a bearing assembly. The friction coefficient varies by temperature, surface roughness, and materials in contact with each other, and surrounding gas (e.g., air) or liquids (e.g., water or sea water). The friction coefficient is taken based on the coating against stainless steel with relatively smooth surfaces in an air environment. The friction coefficient for TiN is approximately 0.40. The friction coefficient for CrN is approximately 0.50, and the friction coefficient for $Cr_2N$ is approximately 0.70. The friction coefficient for $Cr_2O_3$ and $TiO_2$ is approximately 0.30. The friction coefficient for TiAlN is approximately 0.30, and the friction coefficient for TiCN is approximately 0.25.

Coating density and continuity refers to a material's ability to be applied in a thin coating, layer, or film and adhere together and layer on a substrate without generating microcavities and microparticles. A TiN, CrN, $Cr_2N$, $Cr_2O_3$, TiAlN, or TiCN coatings can be deposited with a sub-micron to micron thick film (e.g., 500 nm to 2 μm) that is uniform and continuous with very few microcavities and microparticles, without porosity, or without cracks, which can seal bearing surfaces.

Using CrN, $Cr_2N$, $Cr_2O_3$, or TiAlN as the antiwetting coating can have high corrosion resistance, anti-oxidizing properties, or hardness and wear resistance relative to TiN or $TiO_2$. CrN, $Cr_2N$, $Cr_2O_3$, or TiAlN can have a high temperature capability (e.g., at least 700° C. or approximately 700-800° C.). The antiwetting coating can be deposited with the IBED process which can have faster cycle time than CVD or ALD. The IBED, CVD, or ALD can provide a thin, uniform, and continuous antiwetting coating layer with sub-micron particles or slightly larger particles. Other deposition processes, such as the reactive arc sputtering process, may create micron size particles on the coating surface, which may not be acceptable for sealing surfaces. The micro-particles can hinder the sealing and may cause a leak of liquid metal.

Using CrN, $Cr_2N$, $Cr_2O_3$, or TiAlN as the antiwetting coating provides a robust and high hardness coating that has low susceptibility to oxidation. The technology (devices, assemblies, components, antiwetting coatings, and methods) described herein resolves many of the challenges with existing antiwetting coatings, especially when the antiwetting coatings are used in high temperature applications.

Reference throughout this specification to an "example" or an "embodiment" means that a particular feature, structure, or characteristic described in connection with the example is included in at least one embodiment of the invention. Thus, appearances of the words an "example" or an "embodiment" in various places throughout this specification are not necessarily all referring to the same embodiment.

Furthermore, the described features, structures, or characteristics may be combined in a suitable manner in one or more embodiments. In the following description, numerous specific details are provided (e.g., examples of layouts and designs) to provide a thorough understanding of embodiments of the invention. One skilled in the relevant art will recognize, however, that the invention can be practiced without one or more of the specific details, or with other methods, components, layouts, etc. In other instances, well-known structures, components, or operations are not shown or described in detail to avoid obscuring aspects of the invention.

While the forgoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited. Various features and advantages of the invention are set forth in the following claims.

What is claimed is:
1. A liquid metal container, comprising:
a first enclosure member including a first substrate with a first surface;
a second enclosure member including a second substrate with a second surface, the first enclosure member is positioned proximate to the second enclosure member such that a gap is formed between the first surface and the second surface;
a liquid metal positioned within the gap; and
an antiwetting coating attached to at least one of the first surface and the second surface, wherein the antiwetting coating includes:
at least one selected from the group consisting of chromium nitride (CrN), dichromium nitride ($Cr_2N$), chromium (III) oxide ($Cr_2O_3$), and titanium aluminum nitride (TiAlN) attached to the at least one of the first surface and the second surface; and
an additional oxide layer.

2. The liquid metal container of claim 1, wherein the oxide layer comprises at least 5% of an antiwetting coating thickness.

3. A liquid metal container, comprising:
a first enclosure member including a first substrate with a first surface;
a second enclosure member including a second substrate with a second surface, the first enclosure member is positioned proximate to the second enclosure member such that a gap is formed between the first surface and the second surface;
a liquid metal positioned within the gap; and
an antiwetting coating attached to at least one of the first surface and the second surface, wherein the antiwetting coating includes at least one selected from the group consisting of chromium nitride (CrN), dichromium nitride ($Cr_2N$), chromium (III) oxide ($Cr_2O_3$), and titanium aluminum nitride (TiAlN) attached to the at least one of the first surface and the second surface;
wherein the antiwetting coating has a thickness of at least 100 nanometers (nm).

4. The liquid metal container of claim 3, wherein the gap is between 0.5 microns (μm) and 200 μm.

5. The liquid metal container of claim 3, wherein the first substrate and the second substrate form at least a portion of a cavity to contain the liquid metal.

6. The liquid metal container of claim 3, wherein the liquid metal includes gallium indium tin (GaInSn) alloy, and the first substrate or the second substrate includes molybdenum (Mo) or an iron (Fe) alloy.

7. A liquid metal container, comprising:
a first enclosure member including a first substrate with a first surface;
a second enclosure member including a second substrate with a second surface, the first enclosure member is positioned proximate to the second enclosure member such that a gap is formed between the first surface and the second surface;
a liquid metal positioned within the gap; and
an antiwetting coating attached to at least one of the first surface and the second surface, wherein the antiwetting coating includes at least one selected from the group consisting of chromium nitride (CrN), dichromium nitride ($Cr_2N$), chromium (III) oxide ($Cr_2O_3$), and titanium aluminum nitride (TiAlN) attached to the at least one of the first surface and the second surface;
wherein the first surface and the second surface has an average surface roughness (Ra) and an antiwetting coating thickness is between 1.5 times and 10 times the average surface roughness of the first surface or the second surface.

8. A bearing assembly, comprising:
a stationary component including a first base substrate with a first surface, and a rotatable component including a second base substrate with a second surface wherein the rotatable component is positioned proximate to the stationary component such that a gap is formed between the first surface and the second surface;

a liquid metal positioned within the gap; and an antiwetting coating attached to at least one of the first surface and the second surface, wherein the antiwetting coating contains the liquid metal between the rotatable component and the stationary component, and the antiwetting coating includes at least one selected from the group consisting of chromium nitride (CrN), dichromium nitride ($Cr_2N$), chromium (III) oxide ($Cr_2O_3$), and titanium aluminum nitride (TiAlN) attached to the at least one of the first surface and the second surface.

9. The bearing assembly of claim 8, wherein the rotatable component or the stationary component includes a spiral groove bearing.

10. The bearing assembly of claim 8, further comprising:
a bearing race in the rotatable component or the stationary component; and
at least one ball bearing between the rotatable component and the stationary component.

11. An x-ray tube, comprising:
an insert enclosing a high vacuum;
an anode positioned within the insert; and
the bearing assembly of claim 8 positioned within the insert, and the bearing assembly is mechanically coupled to the anode.

12. The x-ray tube of claim 11, further comprising:
a housing enclosing the insert, wherein the housing includes a radiation window and the housing contains stray radiation and allows x-rays to exit through the radiation window;
a cathode positioned within the insert;
a rotor coupled to the bearing assembly; and
a stator within the housing to electromagnetically rotate the bearing assembly.

13. A method of forming an antiwetting coating on a substrate of a bearing component, the method comprising:
providing a bearing component;
patterning a spiral groove on the bearing component;
smoothing a surface of the bearing component to a surface roughness (Ra) of less than 250 nanometers (nm); and
depositing the antiwetting coating that includes at least one selected from the group consisting of chromium nitride (CrN), dichromium nitride ($Cr_2N$), chromium (III) oxide ($Cr_2O_3$), and titanium aluminum nitride (TiAlN) onto the bearing component, wherein the antiwetting coating is deposited on the surface.

14. The method of claim 13,
wherein smoothing the surface includes grinding, polishing, or lapping.

15. A method of forming an antiwetting coating on a substrate of a bearing component, the method comprising:
providing a bearing component;
patterning a spiral groove on the bearing component; and
depositing the antiwetting coating that includes at least one selected from the group consisting of chromium nitride (CrN), dichromium nitride ($Cr_2N$), chromium (III) oxide ($Cr_2O_3$), and titanium aluminum nitride (TiAlN) onto the bearing component, wherein the antiwetting coating is deposited with a thickness between 100 nanometers (nm) and 2 microns (μm).

16. A method of forming an antiwetting coating on a substrate of a bearing component, the method comprising:
providing a bearing component;
patterning a spiral groove on the bearing component;
depositing the antiwetting coating that includes at least one selected from the group consisting of chromium nitride (CrN), dichromium nitride ($Cr_2N$), chromium (III) oxide ($Cr_2O_3$), and titanium aluminum nitride (TiAlN) onto the bearing component; and
maintaining a deposition chamber that includes the bearing component and the antiwetting coating at a specified temperature less than 250° Celsius (C.) during the depositing of the antiwetting coating.

17. The method of claim 16, further comprising:
determining an operational temperature of an x-ray device including the bearing component above an ambient temperature; and
setting the specified temperature of the deposition chamber to a temperature between 10% and 90% of the operational temperature above the ambient temperature.

18. A method of forming an antiwetting coating on a substrate of a bearing component, the method comprising:
providing a bearing component;
patterning a spiral groove on the bearing component;
depositing the antiwetting coating that includes at least one selected from the group consisting of chromium nitride (CrN), dichromium nitride ($Cr_2N$), chromium (III) oxide ($Cr_2O_3$), and titanium aluminum nitride (TiAlN) onto the bearing component, wherein the depositing of the antiwetting coating includes an ion beam enhanced deposition (IBED), a physical vapor deposition (PVD), a chemical vapor deposition (CVD), or an atomic layer deposition (ALD).

19. The method of claim 18, further comprising:
oxidizing an exposed layer of the antiwetting coating after deposition of the antiwetting coating.

20. The method of claim 18, further comprising:
assembling the bearing component with a second bearing component into a bearing assembly, wherein a gap is formed between the bearing component and the second bearing component; and
inserting liquid metal into the gap.

* * * * *